United States Patent
Ahmed et al.

(10) Patent No.: US 9,515,613 B2
(45) Date of Patent: Dec. 6, 2016

(54) DUAL-BAND DOHERTY AMPLIFIER AND METHOD THEREFOR

(71) Applicants: Abdulrhman M. S. Ahmed, Gilbert, AZ (US); Ramanujam Srinidhi Embar, Gilbert, AZ (US); Yu-Ting D Wu, Gilbert, AZ (US)

(72) Inventors: Abdulrhman M. S. Ahmed, Gilbert, AZ (US); Ramanujam Srinidhi Embar, Gilbert, AZ (US); Yu-Ting D Wu, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 20 days.

(21) Appl. No.: 14/573,669

(22) Filed: Dec. 17, 2014

(65) Prior Publication Data
US 2016/0181990 A1  Jun. 23, 2016

(51) Int. Cl.
*H03F 3/68* (2006.01)
*H03F 1/02* (2006.01)
*H03F 1/56* (2006.01)
*H03F 3/195* (2006.01)

(52) U.S. Cl.
CPC .......... *H03F 1/0288* (2013.01); *H03F 1/0266* (2013.01); *H03F 1/565* (2013.01); *H03F 3/195* (2013.01); *H03F 2200/111* (2013.01); *H03F 2200/222* (2013.01); *H03F 2200/423* (2013.01); *H03F 2200/451* (2013.01)

(58) Field of Classification Search
CPC ............ H03F 1/07; H03F 1/0288; H03F 3/68; H03F 1/3252
USPC   330/84, 86, 124 R, 126, 130, 295; 333/117, 333/122, 124, 204, 205, 219, 248; 379/338, 443; 455/127.1, 143
See application file for complete search history.

(56) References Cited

U.S. PATENT DOCUMENTS

| | | | |
|---|---|---|---|
| 8,502,599 B2 | 8/2013 | Condradi | |
| 2013/0194023 A1* | 8/2013 | Ahmed | G06G 7/10 327/360 |
| 2015/0017934 A1* | 1/2015 | Yamaoka | H03F 3/245 455/114.3 |

FOREIGN PATENT DOCUMENTS

EP   2159912 A1   3/2010

OTHER PUBLICATIONS

Don Tuite, "Understanding Amplifier Operating "Classes"", Electronic Design, Mar. 2012.*
(Continued)

*Primary Examiner* — Steven J Mottola
*Assistant Examiner* — Hafizur Rahman (57) ABSTRACT

A dual-band Doherty amplifier and method therefor are provided. The dual-band Doherty amplifier includes a first amplifier gain element, a first transmission line coupled to a first output of the first amplifier gain element, a second amplifier gain element, a second transmission line coupled to a second output of the second amplifier gain element, and a controller configured, when a signal to be amplified is in a first band, to provide a first bias signal to a first bias input of the first amplifier gain element and a second bias signal to a second bias input of the second amplifier gain element and, when the signal is in a second band, to provide the second bias signal to the first bias input of the first amplifier gain element and the first bias signal to the second bias input of the second amplifier gain element.

17 Claims, 4 Drawing Sheets

(56) References Cited

OTHER PUBLICATIONS

Chen, W. et al., "Design and Linearization of Concurrent Dual-Band Doherty Power Amplifier with Frequency-Dependent Power Ranges," IEE Tra2546.nsactions on Microwave Theory and Techniques, vol. 59, No. 10; Oct. 2011, pp. 2537-.

* cited by examiner

DUAL-BAND DOHERTY AMPLIFIER AND METHOD THEREFOR

CROSS-REFERENCE TO RELATED APPLICATION(S)

Background

Field of the Disclosure

The present disclosure relates generally to radio frequency (RF) power amplifiers (PAs) and more specifically to a Doherty amplifier capable of operation on more than one band.

Background

The Doherty amplifier is extensively used in wireless communication, as it provides high efficiency for modern modulation techniques. Wireless communication benefits from a high data rate, which is achieved through increasing the bandwidth of the amplifier in the base station. Usually the conventional Doherty amplifier is capable of operating over only single frequency band, without the ability to operate over a second frequency band, thereby being unable to provide dual-band operation. Thus, multiple Doherty amplifiers are typically needed to provide operation over multiple frequency bands. One of the main constraints on the range of operating frequencies of a conventional Doherty amplifier is the bandwidth limitation of the output combiner. A typical output combiner is tuned to a particular frequency band, impairing the ability to increase the frequency range of a conventional Doherty amplifier.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DETAILED DESCRIPTION OF THE DRAWINGS

A dual-band Doherty amplifier and method switch between a first amplifier gain element coupled to a first path through an output matching network and serving as a carrier amplifier and a second amplifier gain element coupled to a second path through an output matching network and serving as a peaking amplifier for operation in a first frequency band and the first amplifier gain element serving as the peaking amplifier and the second amplifier gain element serving as the carrier amplifier for operation in a second frequency band. The first path through the output matching network is configured to provide a proper match between a carrier amplifier and a combining point for the first frequency band and a proper match between a peaking amplifier and the combining point for the second frequency band. The second path through the output matching network is configured to provide a proper match between a peaking amplifier and the combining point for the first frequency band and a proper match between a carrier amplifier and the combining point for the second frequency band. Thus, by interchanging the bias conditions between the first amplifier gain element and the second amplifier gain element to select which will serve as a carrier amplifier and which will serve as a peaking amplifier, a dual-band Doherty amplifier and method can be realized.

The dual-band Doherty amplifier includes a first amplifier gain element, a first transmission line coupled to a first output of the first amplifier gain element, a second amplifier gain element, a second transmission line coupled to a second output of the second amplifier gain element, and a controller coupled to a first bias input of the first amplifier gain element and to a second bias input of the second amplifier gain element. The controller is configured, when a signal to be amplified by the first amplifier gain element and the second amplifier gain element is in a first band, to provide a first bias signal to the first bias input of the first amplifier gain element and a second bias signal to the second bias input of the second amplifier gain element and, when the signal is in a second band, to provide the second bias signal to the first bias input of the first amplifier gain element and the first bias signal to the second bias input of the second amplifier gain element. The first transmission line is configured to provide a first electrical length and the second transmission line is configured to provide a second electrical length, wherein the first electrical length and the second electrical length are appropriate to serve as an output matching network for the Doherty amplifier for operation in both the first band and the second band. The first bias signal corresponds to a Class AB amplifier mode, and the second bias signal corresponds to a Class C amplifier mode. The first amplifier gain element is configured to operate as a carrier amplifier and the second amplifier gain element is configured to operate as a peaking amplifier for the first band, and the second amplifier gain element is configured to operate as a carrier amplifier and the first amplifier gain element is configured to operate as a peaking amplifier for the second band.

Figure 1:
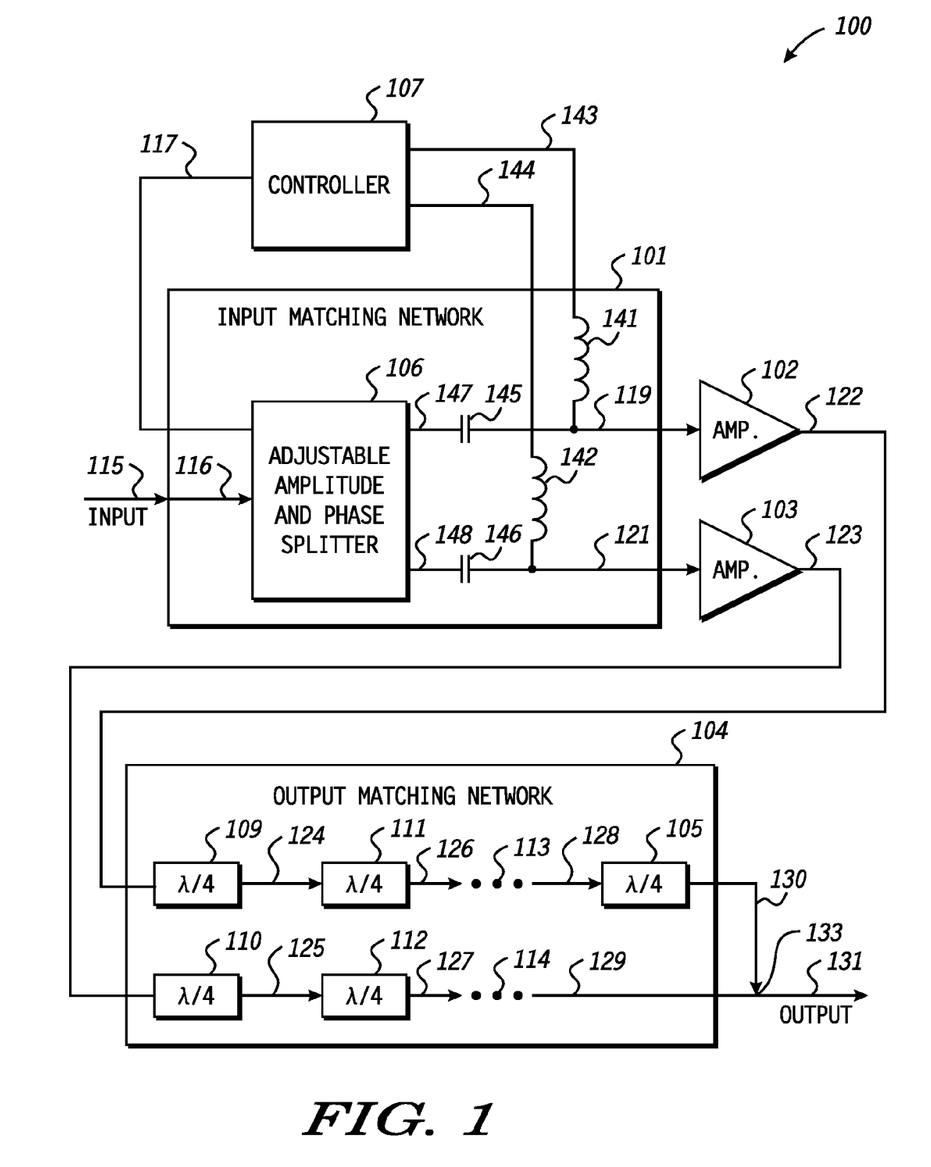
FIG. 1 is a block diagram illustrating apparatus in accordance with at least one embodiment.

FIG. 1 is a block diagram illustrating apparatus in accordance with at least one embodiment. Apparatus 100 includes input matching network 101, controller 107, amplifier element 102, amplifier element 103, and output matching network 104. Input matching network 101 includes adjustable amplitude and phase splitter 106. An input signal is applied to input 115. Input 115 is connected to interconnect 116. Interconnect 116 is connected to adjustable amplitude and phase splitter 106. Adjustable amplitude and phase splitter 106 acts as a power splitter which splits the input signal into two signals having a phase relationship where the phase is not identical. For example, the two signals can be 90 degrees out of phase with one another (e.g., one leads the other, which lags the first, by 90 degrees of phase angle). Adjustable amplitude and phase splitter 106 can be configured to allow individual control of the amplitude and phase of the two signals. Such two signals are provided at outputs 147 and 148 of adjustable amplitude and phase splitter 106. DC blocking on outputs 147 and 148 may be provided, for example, by capacitors 145 and 146, respectively, where output 147 is connected to a first terminal of capacitor 145 and output 148 is connected to a first terminal of capacitor 146. A second terminal of capacitor 145 is connected to input 119 of amplifier element 102. A second terminal of capacitor 146 is connected to input 121 of amplifier element 103.

Different direct current (DC) bias signals are provided to amplifier elements 102 and 103 to cause one of the amplifier elements to operate as a carrier amplifier, for example in a Class AB mode, and to cause the other of the amplifier elements to operate as a peaking amplifier, for example in a Class C mode. A Class AB amplifier is an amplifier having a conduction angle greater than 180 degrees but less than 360 degrees. A Class C amplifier is an amplifier having a conduction angle of less than 180 degrees. The different DC bias signals may be switched between the amplifier elements to select which of the amplifier elements is to function as the carrier amplifier and which of the amplifier elements is to function as the peaking amplifier. Such switching may be performed, for example, using a switch element or, as another example, using another device for alternating the different DC bias signals between the amplifier elements, such as by configuring digital-to-analog converters (DACs) to output the different DC bias levels, where the DACs can be configured to alternate the different DC bias signals between the amplifier elements. For example, the different DC bias signals may be different gate bias signals applied to gates of field effect transistor (FET) amplifier gain elements.

In the example shown in FIG. 1, interconnect 117 provides a signal from adjustable amplitude and phase splitter 106 to controller 107. As an example, the signal provided via interconnect 117 can indicate in which band of a plurality of bands the apparatus is to operate. Adjustable amplitude and phase splitter 106 controls different DC bias levels provided to outputs 143 and 144. In a first configuration, controller 107 provides a Class AB bias level to output 143 and a Class C bias level to output 144. In a second position, controller 107 provides a Class AB bias level to output 144 and a Class C bias level to output 143. Output 143 is connected to input 119 of amplifier element 102, for example, by a high-impedance element 141. Output 144 is connected to input 121 of amplifier element 103, for example, by high-impedance element 142. High-impedance elements 141 and 142 can be elements that exhibit high resistance, high inductive reactance, or a combination thereof, relative to the characteristic impedance of the inputs of amplifier elements 102 and 103. Thus, in the first position of controller 107, amplifier element 102 is biased to provide Class AB operation, configuring it to act as the carrier amplifier, and amplifier element 103 is biased to provide Class C operation, configuring it to act as the peaking amplifier, while, in the second position of controller 107, amplifier element 102 is biased to provide Class C operation, configuring it to act as the peaking amplifier, and amplifier element 103 is biased to provide Class AB operation, configuring it to act as the carrier amplifier.

Amplifier element 102 provides amplifier output 122. Amplifier element 103 provides amplifier output 123. Output matching network 104 includes a plurality of quarter-wave transmission lines 109 and 111 and an asymmetrically disposed quarter-wave transmission line 105 in series with amplifier output 122 and a plurality of quarter-wave transmission lines 110 and 112 in series with amplifier output 123. The plurality of quarter-wave transmission lines in series with amplifier output 122 may include additional quarter-wave transmission lines, as indicated by ellipsis 113. The plurality of quarter-wave transmission lines in series with amplifier output 123 may include additional quarter-wave transmission lines, as indicated by ellipsis 114. Asymmetrically disposed quarter-wave transmission line 105 is present in a first path through output matching network 104 from one of amplifier gain elements 102 and 103, but not in a second path through output matching network 104 from the other of amplifier gain elements 102 and 103. Asymmetrically disposed quarter-wave transmission line 105 introduces a relative phase shift between first path and the second path through output matching network 104 so that amplifier output 122 and amplifier output 123 can be combined out of phase with each other.

Amplifier output 122 is connected to a first end of quarter-wave transmission line 109. A second end of quarter-wave transmission line 109 is connected to interconnect 124. Interconnect 124 is connected to a first end of quarter-wave transmission line 111. A second end of quarter-wave transmission line 111 is connected to interconnect 126. Interconnect 126 is connected to node 128 either directly or through any additional quarter-wave transmission lines indicated by ellipsis 113. Node 128 is connected to a first end of asymmetrically disposed quarter-wave transmission line 105. A second end of asymmetrically disposed quarter-wave transmission line 105 is connected to output 130. Amplifier output 122, interconnect 124 and 126, ellipsis 113, node 128, and output 130 are illustrated as lines or dots of some length for clarity. However, in practice, they are of zero length. Thus, the length along a first path through output matching network 104 between a semiconductor die reference plane of amplifier 102 and combining point 133, where output 130 is combined with output 129, is equal to the sum of quarter-wave transmission lines 109, 111, and 105, along with any quarter-wave transmission lines represented by ellipsis 113.

Amplifier output 123 is connected to a first end of quarter-wave transmission line 110. A second end of quarter-wave transmission line 110 is connected to interconnect 125. Interconnect 125 is connected to a first end of quarter-wave transmission line 112. A second end of quarter-wave transmission line 112 is connected to interconnect 127. Interconnect 127 is connected to output 129 either directly or through any additional quarter-wave transmission lines indicated by ellipsis 114. Output 130 and output 129 are connected together to provide combined output 131 as the output of the Doherty amplifier. Amplifier output 123, interconnects 125 and 127, ellipsis 114, and output 129 are illustrated as lines or dots of some length for clarity. However, in practice, they are of zero length. Thus, the length a second path through output matching network 104 between a semiconductor die reference plane of amplifier 103 and combining point 133, where output 130 is combined with output 129, is equal to the sum of quarter-wave transmission lines 110 and 112, along with any quarter-wave transmission lines represented by ellipsis 114.

If impedance matching is desired to match the output impedances of amplifiers 102 and 103 to an impedance desired at combined output 131, such impedance matching may be implemented, for example, by selecting transmission lines of suitable characteristic impedances to act as impedance transformers. As an example, one or more of quarter-wave transmission lines 109, 110, 111, and 112 may be implemented as transmission lines having characteristic impedances to act as impedance transformers. As another example, an additional matching network may be implemented along combined output 131 after outputs 130 and 129 have been combined at combining point 133.

A transmission line section having an electrical length of a quarter of a wavelength acts as an impedance inverter. Impedance inversion can be used to combine, for example, two Doherty amplifier gain elements into a single combined output. Asymmetrically disposed quarter-wave transmission line 105 provides impedance inversion to effect such combining of amplifier outputs 122 and 123 into a single combined output 131. Any number of symmetrically disposed quarter-wave transmission lines, such as quarter-wave transmission lines 109 and 110 disposed symmetrically with respect to each other in their respective first and second paths through output matching network 104 and quarter-wave transmission lines 111 and 112 disposed symmetrically with respect to each other in the first and second paths, respectively, can be provided. Since each quarter-wave transmission line inverts the impedance and since two consecutive quarter-wave transmission lines invert, then re-invert, the impedance, odd numbers of symmetrically disposed quarter-wave transmission lines along each path cumulatively provide impedance inversion, which can be used to provide an inverted Doherty amplifier, while even numbers of symmetrically disposed quarter-wave transmission lines along each path cumulatively maintain the original impedance, which can be used to provide a non-inverted Doherty amplifier. An additional even number of asymmetrically disposed quarter-wave transmission lines can be provided in either a first or a second path of output matching network 104, as the additional even number of asymmetrically disposed quarter wave transmission lines will invert, then re-invert, the impedance along the path in which they are disposed.

Table 1 shows examples of output matching configurations for a Doherty amplifier system in accordance with exemplary embodiments. In table 1, nc refers to a number of quarter-wave transmission lines in a path from the amplifier output of a carrier gain element, np refers to a number of quarter-wave transmission lines in a path from the amplifier output of a peaking gain element, and the ratio refers to the ratio of the combined length of the nc quarter-wave transmission lines to the combined length of the np quarter-wave transmission lines. Configurations listed as reversed have nc and np reversed from configurations listed as normal. To put the configurations of Table 1 in the context of output matching network 104 of FIG. 1, consider, for example, the normal configuration having nc=3 and np=4. If amplifier gain element 102 is the carrier amplifier and amplifier gain element 103 is the peaking amplifier, the three quarter-wave transmission lines represented by nc=3 will be, for example, symmetrically disposed quarter-wave transmission lines 109 and 111 and asymmetrically disposed quarter-wave transmission line 105, and the four quarter-wave transmission lines represented by np=4 will be, for example, symmetrically disposed quarter-wave transmission lines 110 and 112 and an additional two asymmetrically disposed quarter-wave transmission lines indicated by ellipsis 114.

Table 2 shows the configurations of Table 1 sorted by their ratios. Normal configurations and reversed configurations with approximately similar ratios can be used to identify a combination of a normal configuration and a reversed configuration suitable for use in the output matching network 104 of a dual-band Doherty amplifier system, as illustrated, for example, by apparatus 100 of FIG. 1.

TABLE 1

Doherty configurations

|  | nc | np | ratio |
|---|---|---|---|
| normal | 1 | 2 | 0.5 |
| normal | 3 | 2 | 1.5 |
| normal | 5 | 2 | 2.5 |
| normal | 7 | 2 | 3.5 |
| normal | 1 | 4 | 0.25 |
| normal | 3 | 4 | 0.75 |
| normal | 5 | 4 | 1.25 |
| normal | 7 | 4 | 1.75 |
| normal | 1 | 6 | 0.16667 |
| normal | 3 | 6 | 0.5 |
| normal | 5 | 6 | 0.83333 |

TABLE 1-continued

Doherty configurations

|  | nc | np | ratio |
|---|---|---|---|
| normal | 7 | 6 | 1.16667 |
| reversed | 2 | 1 | 2 |
| reversed | 2 | 3 | 0.66667 |
| reversed | 2 | 5 | 0.4 |
| reversed | 2 | 7 | 0.28571 |
| reversed | 4 | 1 | 4 |
| reversed | 4 | 3 | 1.33333 |
| reversed | 4 | 5 | 0.8 |
| reversed | 4 | 7 | 0.57143 |
| reversed | 6 | 1 | 6 |
| reversed | 6 | 3 | 2 |
| reversed | 6 | 5 | 1.2 |
| reversed | 6 | 7 | 0.85714 |

TABLE 2

Configurations sorted by ratio

|  | nc | np | ratio |
|---|---|---|---|
| normal | 1 | 6 | 0.16667 |
| normal | 1 | 4 | 0.25 |
| reversed | 2 | 7 | 0.28571 |
| reversed | 2 | 5 | 0.4 |
| normal | 1 | 2 | 0.5 |
| normal | 3 | 6 | 0.5 |
| reversed | 4 | 7 | 0.57143 |
| reversed | 2 | 3 | 0.66667 |
| normal | 3 | 4 | 0.75 |
| reversed | 4 | 5 | 0.8 |
| normal | 5 | 6 | 0.83333 |
| reversed | 6 | 7 | 0.85714 |
| normal | 7 | 6 | 1.16667 |
| reversed | 6 | 5 | 1.2 |
| normal | 5 | 4 | 1.25 |
| reversed | 4 | 3 | 1.33333 |
| normal | 3 | 2 | 1.5 |
| normal | 7 | 4 | 1.75 |
| reversed | 2 | 1 | 2 |
| reversed | 6 | 3 | 2 |
| normal | 5 | 2 | 2.5 |
| normal | 7 | 2 | 3.5 |
| reversed | 4 | 1 | 4 |
| reversed | 6 | 1 | 6 |

Table 3 shows a pair of output matching network quarter-wave transmission line configurations, one of which, according to Table 2 above, can be considered to approximate the other when the carrier gain element and the peaking gain element are interchanged. The ratio of Table 3 is a ratio of the ratios of Table 2 for the two specified configurations. The fit of Table 3 describes how closely one of the specified configurations approximates the other specified configuration. The wl ratio of Table 3 describes a relationship between the specified configurations based on normalized wavelength.

The wl fit of Table 3 describes how closely one of the specified configurations approximates the other specified configuration based on normalized wavelength. The deg wl fit of Table 3 shows wl fit expressed as degrees of phase shift. The mean b of Table 3 shows a band multiplier of a nominal frequency of a second band of operation relative to a nominal frequency of a first band of operation based on an average of the relationships of the quarter-wave transmission lines along one path through output matching network 104 and the quarter-wave transmission lines along the other path through output matching network 104, wherein those relationships are obtained by comparing operation of the quarter-wave transmission lines between the two specified configurations.

TABLE 3

Exemplary configurations

| config. | ratio | fit | wl ratio | wl fit | deg wl fit | mean b |
|---|---|---|---|---|---|---|
| 7:4, 1:2 | 1.14 | 14% | 0.88 | −13% | −11.25 | 3.75 |
| 3:2, 1:2 | 1.33 | 33% | 0.75 | −25% | −22.5 | 1.75 |
| 5:2, 1:2 | 0.80 | −20% | 1.25 | 25% | 22.5 | 2.25 |
| 7:2, 1:4 | 1.14 | 14% | 0.88 | −13% | −11.25 | 1.88 |
| 3:2, 3:4 | 0.89 | −11% | 1.13 | 13% | 11.25 | 0.71 |
| 5:4, 3:4 | 1.07 | 7% | 0.94 | −6% | −5.625 | 1.29 |
| 5:4, 5:6 | 0.96 | −4% | 1.04 | 4% | 3.75 | 0.82 |
| 7:6, 5:6 | 1.03 | 3% | 0.97 | −3% | −2.5 | 1.18 |
| 3:6, 5:2 | 0.80 | −20% | 1.25 | 25% | 22.5 | 1.35 |

As shown by Table 3, a range of ratios of ratios can be deemed to show satisfactory approximation of one Doherty amplifier output matching network configuration to an interchanged version of another. To calculate the ratio of ratios with respect to the first example, 7:4, 1:2, of Table 3, the two of 1:2 is divided by the one of 1:2, and the result is divided by the quantity seven of 7:4 divided by the four of 7:4 to yield the resulting ratio of ratios 1.14. To calculate the ratio of ratios with respect to the second example, 3:2, 1:2, of Table 3, the two of 1:2 is divided by the one of 1:2, and the result is divided by the quantity three of 3:2 divided by the two of 3:2 to yield the resulting ratio of ratios 1.33. As one example, a range of ratios of ratios from 0.75 to 1.34 is deemed to indicate that one Doherty amplifier output matching network configuration approximates an interchanged version of the other. As another example, a range of ratios of ratios from 0.80 to 1.25 is deemed to indicate that one Doherty amplifier output matching network configuration approximates an interchanged version of the other. As another example, a range of ratios of ratios from 0.85 to 1.18 is deemed to indicate that one Doherty amplifier output matching network configuration approximates an interchanged version of the other. As another example, a range of ratios of ratios from 0.90 to 1.11 is deemed to indicate that one Doherty amplifier output matching network configuration approximates the interchanged version of the other.

For the exemplary configuration 7:4, 1:2, seven quarter-wave transmission lines along a first path and four quarter-wave transmission lines along a second path provide an output matching network having a 7:4 configuration suitable for a Doherty amplifier with a first gain element configured as a carrier amplifier and a second gain amplifier configured as a peaking amplifier and approximate an output matching network having a 1:2 configuration suitable for a Doherty amplifier with the second gain element configured as the carrier amplifier and the first gain element configured as the peaking amplifier. Based on the mean b of Table 3, the 7:4 configuration is suitable for a higher band of operation having a nominal frequency approximately 3.75 times the nominal frequency of a lower band of operation for which the 1:2 configuration is suitable. As an example, the band multiple of approximately 3.75 can be included within a range from 3.5 to 4.0, wherein a band multiple of operation can be selected from within such a range.

For the exemplary configuration 3:2, 1:2, three quarter-wave transmission lines along a first path and a two quarter-wave transmission lines along a second path provide an output matching network having a 3:2 configuration suitable for a Doherty amplifier with a first gain element configured as a carrier amplifier and a second gain amplifier configured as a peaking amplifier and approximate an output matching network having a 1:2 configuration suitable for a Doherty amplifier with the second gain element configured as the carrier amplifier and the first gain element configured as the peaking amplifier. Based on the mean b of Table 3, the 3:2 configuration is suitable for a higher band of operation having a nominal frequency approximately 1.75 times the nominal frequency of a lower band of operation for which the 1:2 configuration is suitable. As an example, the band multiple of approximately 1.75 can be included within a range from 1.5 to 2.0, wherein a band multiple of operation can be selected from within such a range.

For the exemplary configuration 5:2, 1:2, five quarter-wave transmission lines along a first path and a two quarter-wave transmission lines along a second path provide an output matching network having a 5:2 configuration suitable for a Doherty amplifier with a first gain element configured as a carrier amplifier and a second gain amplifier configured as a peaking amplifier and approximate an output matching network having a 1:2 configuration suitable for a Doherty amplifier with the second gain element configured as the carrier amplifier and the first gain element configured as the peaking amplifier. Based on the mean b of Table 3, the 5:2 configuration is suitable for a higher band of operation having a nominal frequency approximately 2.25 times the nominal frequency of a lower band of operation for which the 1:2 configuration is suitable. As an example, the band multiple of approximately 2.25 can be included within a range from 2.0 to 2.5, wherein a band multiple of operation can be selected from within such a range.

For the exemplary configuration 7:2, 1:4, seven quarter-wave transmission lines along a first path and a two quarter-wave transmission lines along a second path provide an output matching network having a 7:2 configuration suitable for a Doherty amplifier with a first gain element configured as a carrier amplifier and a second gain amplifier configured as a peaking amplifier and approximate an output matching network having a 1:4 configuration suitable for a Doherty amplifier with the second gain element configured as the carrier amplifier and the first gain element configured as the peaking amplifier. Based on the mean b of Table 3, the 7:2 configuration is suitable for a higher band of operation having a nominal frequency approximately 1.88 times the nominal frequency of a lower band of operation for which the 1:4 configuration is suitable. As an example, the band multiple of approximately 1.88 can be included within a range from 1.4 to 2.3, wherein a band multiple of operation can be selected from within such a range.

For the exemplary configuration 3:2, 3:4, three quarter-wave transmission lines along a first path and a two quarter-wave transmission lines along a second path provide an output matching network having a 3:2 configuration suitable for a Doherty amplifier with a first gain element configured as a carrier amplifier and a second gain amplifier configured as a peaking amplifier and approximate an output matching network having a 3:4 configuration suitable for a Doherty amplifier with the second gain element configured as the carrier amplifier and the first gain element configured as the peaking amplifier. Based on the mean b of Table 3, the 3:2 configuration is suitable for a lower band of operation having a nominal frequency approximately 0.71 times the nominal frequency of a higher band of operation for which the 3:4 configuration is suitable. As an example, the band multiple of approximately 0.71 can be included within a range from 0.5 to 1.0, wherein a band multiple of operation can be selected from within such a range.

For the exemplary configuration 5:4, 3:4, five quarter-wave transmission lines along a first path and a four quarter-wave transmission lines along a second path provide an output matching network having a 5:4 configuration suitable for a Doherty amplifier with a first gain element configured as a carrier amplifier and a second gain amplifier configured as a peaking amplifier and approximate an output matching network having a 3:4 configuration suitable for a Doherty amplifier with the second gain element configured as the carrier amplifier and the first gain element configured as the peaking amplifier. Based on the mean b of Table 3, the 5:4 configuration is suitable for a higher band of operation having a nominal frequency approximately 1.29 times the nominal frequency of a lower band of operation for which the 3:4 configuration is suitable. As an example, the band multiple of approximately 1.29 can be included within a range from 1.0 to 1.6, wherein a band multiple of operation can be selected from within such a range.

For the exemplary configuration 5:4, 5:6, five quarter-wave transmission lines along a first path and a four quarter-wave transmission lines along a second path provide an output matching network having a 5:4 configuration suitable for a Doherty amplifier with a first gain element configured as a carrier amplifier and a second gain amplifier configured as a peaking amplifier and approximate an output matching network having a 5:6 configuration suitable for a Doherty amplifier with the second gain element configured as the carrier amplifier and the first gain element configured as the peaking amplifier. Based on the mean b of Table 3, the 5:4 configuration is suitable for a lower band of operation having a nominal frequency approximately 0.82 times the nominal frequency of a higher band of operation for which the 5:6 configuration is suitable. As an example, the band multiple of approximately 0.82 can be included within a range from 0.5 to 1.1, wherein a band multiple of operation can be selected from within such a range.

For the exemplary configuration 7:6, 5:6, seven quarter-wave transmission lines along a first path and a six quarter-wave transmission lines along a second path provide an output matching network having a 7:6 configuration suitable for a Doherty amplifier with a first gain element configured as a carrier amplifier and a second gain amplifier configured as a peaking amplifier and approximate an output matching network having a 5:6 configuration suitable for a Doherty amplifier with the second gain element configured as the carrier amplifier and the first gain element configured as the peaking amplifier. Based on the mean b of Table 3, the 7:6 configuration is suitable for a higher band of operation having a nominal frequency approximately 1.18 times the nominal frequency of a lower band of operation for which the 5:6 configuration is suitable. As an example, the band multiple of approximately 1.18 can be included within a range from 0.9 to 1.5, wherein a band multiple of operation can be selected from within such a range.

For the exemplary configuration 3:6, 5:2, three quarter-wave transmission lines along a first path and a six quarter-wave transmission lines along a second path provide an output matching network having a 3:6 configuration suitable for a Doherty amplifier with a first gain element configured as a carrier amplifier and a second gain amplifier configured as a peaking amplifier and approximate an output matching network having a 5:2 configuration suitable for a Doherty amplifier with the second gain element configured as the carrier amplifier and the first gain element configured as the peaking amplifier. Based on the mean b of Table 3, the 3:6 configuration is suitable for a higher band of operation having a nominal frequency approximately 1.35 times the nominal frequency of a lower band of operation for which the 5:2 configuration is suitable. As an example, the band multiple of approximately 1.35 can be included within a range from 1.1 to 1.6, wherein a band multiple of operation can be selected from within such a range.

While the quarter-wave transmission lines are illustrated as individual quarter-wave transmission lines, the quarter-wave transmission lines need not be implemented individually. Rather, for each path through output matching network 104, a single transmission line having a length equal to the combined length of all of the quarter-wave transmission lines in that path can be provided. A single combined transmission line for each path can avoid impedance discontinuities, especially when switching to a different band of the dual-band Doherty amplifier system, wherein the different band has a different wavelength of a band for which the quarter-wave transmission line length determinations were performed.

At the outputs of Doherty amplifier gain elements, the distances over which the output signals travel until they are merged in phase with each other can include conductive structures other than explicitly defined on-chip transmission lines. For example, conductive portions of the package in which the Doherty amplifier is constructed and output matching networks can add to the lengths of the paths the output signals travel. If the entire path from a Doherty amplifier gain element output to the point where the Doherty amplifier gain element outputs are merged is measured in units of quarter-wave transmission line sections, Doherty amplifiers can be found to exhibit various feasible ratios of the number of quarter-wave transmission line sections spanned by the Doherty carrier amplifier gain element output path and the Doherty peaking amplifier gain element output path. The electrical length of the entire paths described above should be included to determine transmission line electrical lengths in relation to multiples of quarter wavelengths of a signal in a first or second frequency band.

Output 128 is connected to a first end of quarter-wave transmission line 105. A second end of quarter-wave transmission line 105 is connected to output 130. Output 130 is connected with output 129 to combine, in phase, the output signals provided by amplifier elements 102 and 103 at combined output 131, as the output of the Doherty amplifier system.

Controller 107 may be implemented, for example, by an electronically controlled switch, which may be controlled, for example, by a band selection signal. The band selection signal may be provided, for example, by a controller. The band selection signal may have one value when the apparatus is to operate on one band and another value when the apparatus is to operate on another band. Controller 107 may be implemented by other equivalents, for example, two digital-to-analog converters (DACs) configured to provide, and switch between providing, the respective bias levels. Such DACs may be controlled, for example, by a controller.

Figure 2:
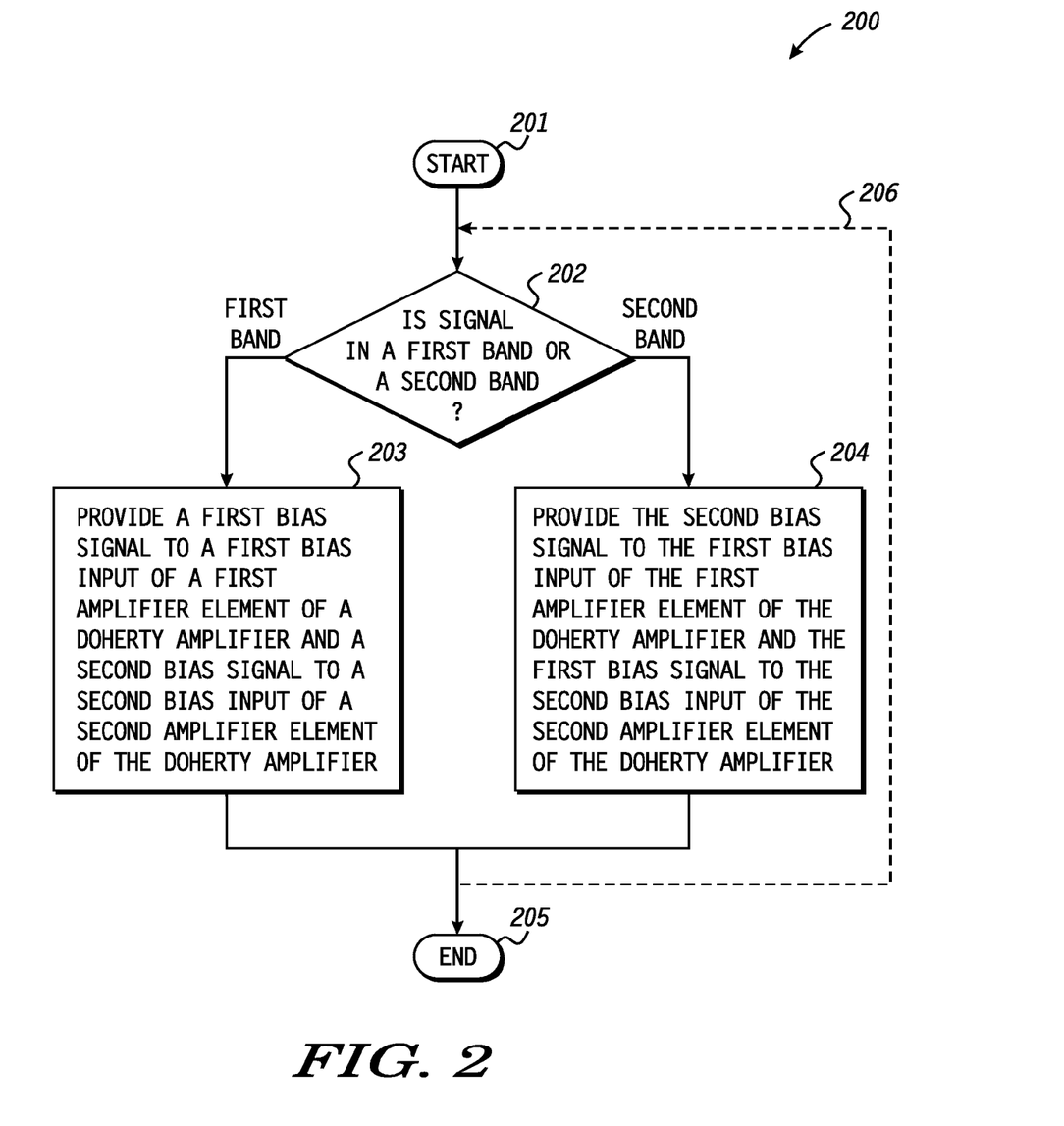
FIG. 2 is a flow diagram illustrating a method in accordance with at least one embodiment.

FIG. 2 is a flow diagram illustrating a method in accordance with at least one embodiment. Method 200 begins in block 201. From block 201, method 200 continues to decision block 202. In decision block 202, a decision is made as to whether a signal to be amplified by a Doherty amplifier is in a first band or in a second band. If the signal is in the first band, method 200 continues from decision block 202 to block 203. In block 203, a first bias signal is provided to a first bias input of a first amplifier element of a Doherty amplifier and a second bias signal is provided to a second bias input of a second amplifier element of the Doherty amplifier. A first output of the first amplifier element is connected to a first series of a first number of quarter-wave transmission line elements. A second output of the second amplifier element is connected to a second series of a second number of quarter-wave transmission line elements. If the decision in decision block 202 is that the signal is in the second band, method 200 continues from decision block 202 to block 204. In block 204, the second bias signal is provided to the first bias input of the first amplifier element of the Doherty amplifier and the first bias signal is provided to the second bias input of the second amplifier element of the Doherty amplifier. A first output of the first amplifier element is connected to a first series of a first number of quarter-wave transmission line elements. A second output of the second amplifier element is connected to a second series of a second number of quarter-wave transmission line elements. From either block 203 or block 204, method 200 continues to block 205, where it ends. Alternatively, the method may return from either block 203 or block 204 to decision block 202, as indicated by dashed line 206.

In accordance with at least one embodiment, the first series provides a third number of quarter-wave transmission line elements for the second band and the second series provides a fourth number of quarter-wave transmission line elements for the second band based on a difference of wavelengths between the first band and the second band. In accordance with at least one embodiment, the first bias signal corresponds to a carrier amplifier signal and the second bias signal corresponds to a peaking amplifier signal, wherein first number of quarter-wave transmission line elements is a first odd number, the second number of quarter-wave transmission line elements is a first even number, the third number of quarter-wave transmission line elements is a second even number, and the fourth number of quarter-wave transmission line elements is a second odd number. In accordance with at least one embodiment, the first series includes an entire first path from the first output of the first amplifier gain element to an output merging point and the second series includes an entire second path from the second output of the second amplifier gain element to the output merging point. In accordance with at least one embodiment, the first bias signal corresponds to a Class AB amplifier mode and the second bias signal corresponds to a Class C amplifier mode. In accordance with at least one embodiment, the method further includes adjusting a phase difference of a first gain element input signal applied to a first input of the first amplifier gain element and a second gain element input signal applied to a second input of the second amplifier gain element to provide compensation for a first electrical length of the first series of the first number of quarter-wave transmission line elements for the first band and for a second electrical length of the second series of the second number of quarter-wave transmission line elements for the first band. In accordance with at least one embodiment, the method further includes operating the first amplifier gain element as a carrier amplifier and the second amplifier gain element as a peaking amplifier for the first band and operating the second amplifier gain element as a carrier amplifier and the first amplifier gain element as a peaking amplifier for the second band.

Figure 3:
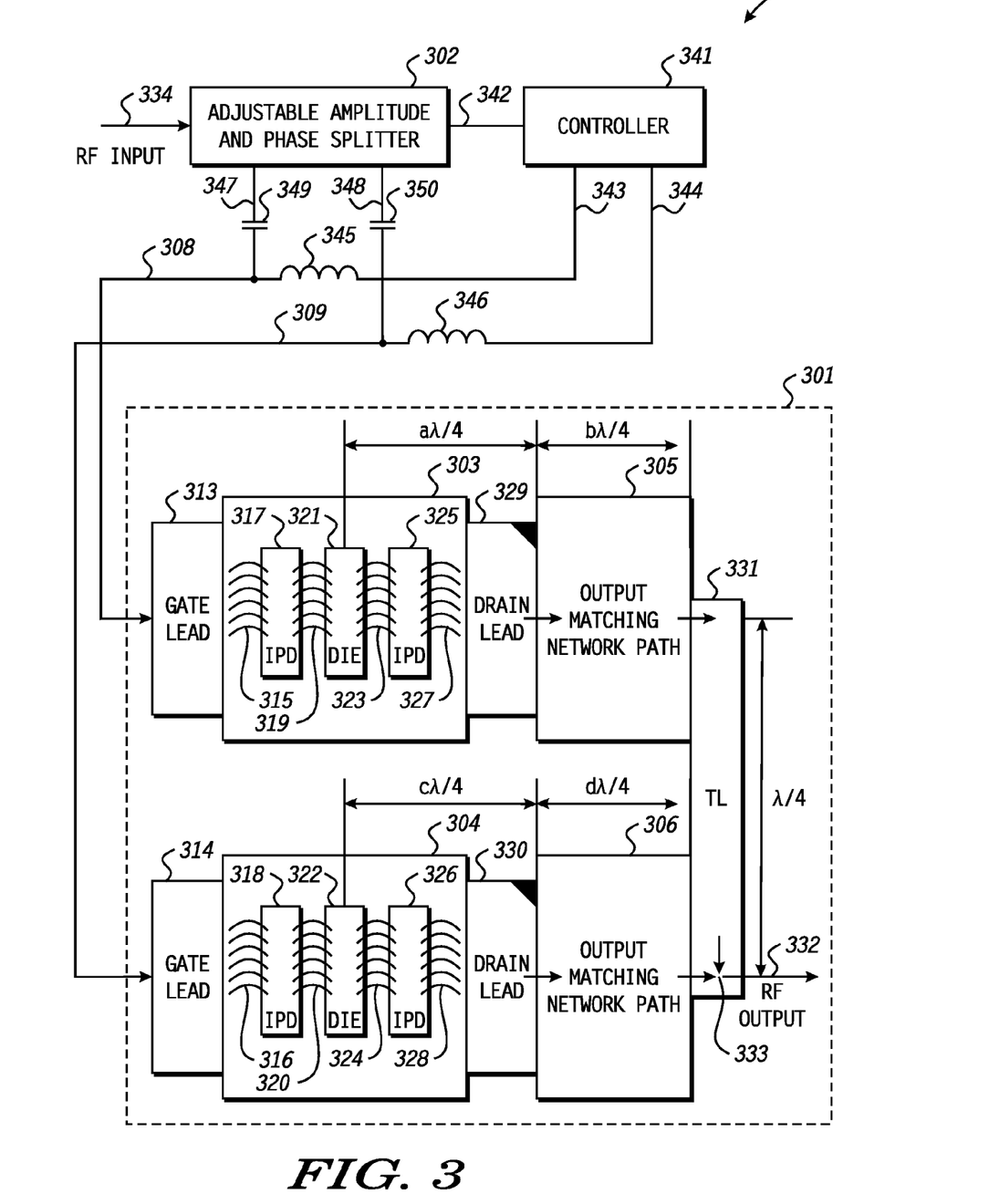
FIG. 3 is a plan view diagram illustrating a device in accordance with at least one embodiment.

FIG. 3 is a plan view diagram illustrating a Doherty amplifier system in accordance with at least one embodiment. Doherty amplifier system 300 includes adjustable amplitude and phase splitter 302 and Doherty amplifier 301. Doherty amplifier 301 includes amplifier gain element 303, amplifier gain element 304, output matching network path 305, output matching network path 306, and quarter-wave transmission line 331. A RF input signal is provided at RF input 334 of adjustable amplitude and phase splitter 302. Adjustable amplitude and phase splitter 302 provides outputs 347 and 348 having a suitable amplitude and phase relationship to each other to provide input signals for a Doherty amplifier. Outputs 347 and 348 are connected to a coupling element, for example, first terminals of capacitors 349 and 350, respectively, to provide alternating current (AC) coupling of outputs 347 and 348 to amplifier gain element gate leads 313 and 314, respectively. Adjustable amplitude and phase splitter 302 is connected to controller 341 via connection 342. Controller 341 is responsive to a band of operation in which the RF input signal at RF input 334 lies. Controller 341 provides outputs 343 and 344 to provide gate bias levels for amplifier gain elements 303 and 304. Output 343 is connected to a first terminal of inductor 345. Output 344 is connected to a first terminal of inductor 346. A second terminal of inductor 345 is connected to a second terminal of capacitor 349 and to input 308 of amplifier gain element 303. A second terminal of inductor 346 is connected to a second terminal of capacitor 350 and to input 309 of amplifier gain element 304. Input 308 is connected to gate lead 313 of amplifier gain element 303. Input 309 is connected to gate lead 314 of amplifier gain element 304.

Gate lead 313 is connected to bonding wires 315. Bonding wires 315 are connected to integrated passive device 317. Integrated passive device 317 is connected to bonding wires 319. Bonding wires 319 are connected to semiconductor device die 321. Semiconductor device die 321 is connected to, and provides an amplified output signal through, bonding wires 323. Bonding wires 323 are connected to integrated passive device 325. Integrated passive device 325 is connected to bonding wires 327. Bonding wires 327 are connected to drain lead 329 of amplifier gain element 303. Drain lead 329 is connected to a first end of output matching network path 305. A second end of output matching network path 305 is connected to a first end of quarter-wave transmission line 331.

Gate lead 314 is connected to bonding wires 316. Bonding wires 316 are connected to integrated passive device 318. Integrated passive device 318 is connected to bonding wires 320. Bonding wires 320 are connected to semiconductor device die 322. Semiconductor device die 322 is connected to, and provides an amplified output signal through, bonding wires 324. Bonding wires 324 are connected to integrated passive device 326. Integrated passive device 326 is connected to bonding wires 328. Bonding wires 328 are connected to drain lead 330 of amplifier gain element 304. Drain lead 330 is connected to a first end of output matching network path 306. A second end of output matching network path 306 is connected to a second end of quarter-wave transmission line 331. A combining point 333 exists at the second end of quarter-wave transmission line 331, where the amplified output signal from amplifier gain element 303 is combined with the amplified output signal from amplifier gain element 304 to provide a final RF output signal at RF output 332.

Figure 4:
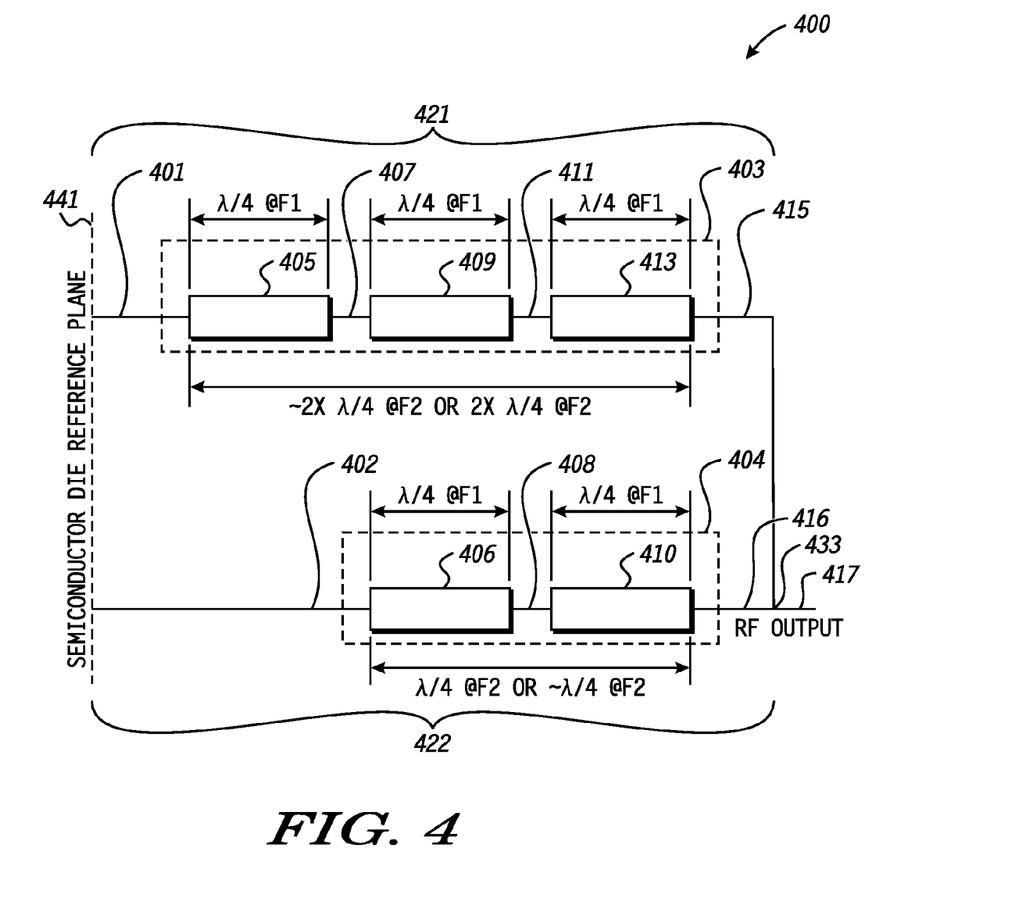
FIG. 4 is a schematic diagram illustrating a Doherty amplifier output combiner for a dual-band Doherty amplifier system in accordance with at least one embodiment.

Output matching network paths 305 and 306 can be implemented using transmission lines, for example, transmission lines implemented as microstrip lines. As an example, the lengths of bonding wires 323 and 327, with their inductance compensated by a capacitor formed by integrated passive device 325, combined with the length of drain lead 329, can form a transmission line having a length a, denominated in quarter wavelengths. One or more transmission lines of output matching network path 305 can have a length b, denominated in quarter wavelengths. As an example, the lengths of bonding wires 324 and 328, with their inductance compensated by a capacitor formed by integrated passive device 326, combined with the length of drain lead 330, can form a transmission line having a length c, denominated in quarter wavelengths. One or more transmission lines of output matching network path 306 can have a length d, denominated in quarter wavelengths. Transmission line 331 connecting the output of output matching network path 305 to the output of output matching network path 306 assures the cumulative transmission line length from die 321 to combining point 333 differs from the cumulative transmission line length from die 322 to combining point 333. The cumulative transmission line lengths and their difference is selected to provide a difference of approximately an odd multiple of a quarter wavelength for wavelengths in a first band of operation and approximately an odd multiple of a quarter wavelength for wavelengths in a second band of operation and to provide a proper Doherty amplifier output combiner when the gain elements are configured to interchange between serving as a carrier amplifier and a peaking amplifier when the frequency of operation changes between the first band and the second band FIG. 4 is a schematic diagram illustrating a Doherty amplifier output combiner for a dual-band Doherty amplifier system in accordance with at least one embodiment. Doherty amplifier output combiner 400 includes a first path 421 and a second path 422. First path 421 extends from an output of a first amplifier gain element at semiconductor die reference plane 441 to combining point 433. Second path 422 extends from an output of a second amplifier gain element at semiconductor die reference plane 441 to combining point 433, where the outputs of the first amplifier gain element and the second amplifier gain element are combined to provide an RF output signal at RF output 417. While interconnections 401, 407, 411, 415 are shown in the first path 421 and interconnections 402, 408, and 416 are shown in the second path 422 for the purpose of clarity, such interconnections are intended to be of zero length in practice. Thus, for example, in the first path 421, the total length between semiconductor die reference plane 441 and combining point 433 is the sum of the lengths of transmission lines 405, 409, and 413, and, in the second path 422, the total length between semiconductor die reference plane 441 and combining point 433 is the sum of the lengths of transmission lines 406 and 410.

From the output of the first amplifier gain element at semiconductor die reference plane 441, first path 421 begins at interconnection 401, which is connected to a first end of a combined transmission line 403, which is a series combination of a plurality of transmission lines, each of which has an electrical length of a quarter wavelength at a frequency in a first band of operation. In the illustrated example, the plurality of transmission lines includes transmission lines 405, 409, and 413. A second end of transmission line 405 is connected to a first end of transmission line 409 at interconnection 407. A second end of transmission line 409 is connected to a first end of transmission line 413 at interconnection 411. A second end of transmission line 413, at the second end of combined transmission line 403, is connected to interconnection 415. Interconnection 415 is connected to combining point 433.

From the output of the second amplifier gain element at semiconductor die reference plane 441, second path 422 begins at interconnection 402, which is connected to a first end of a combined transmission line 404, which is a series combination of a plurality of transmission lines, each of which has an electrical length of a quarter wavelength at a frequency in a first band of operation. In the illustrated example, the plurality of transmission lines includes transmission lines 406 and 410. A second end of transmission line 406 is connected to a first end of transmission line 410 at interconnection 408. A second end of transmission line 410, at the second end of combined transmission line 404, is connected to interconnection 416. Interconnection 416 is connected to combining point 433. At combining point 433, a signal at interconnection 415 is combined with a signal at interconnection 416 to provide an RF output signal at RF output 417.

As shown in FIG. 4, at a first frequency F1 of a first band of operation, transmission lines 405, 409, and 413 in the first path 421 and transmission lines 406 and 410 in the second path 422 each have an electrical length of a quarter wavelength for the wavelength of first frequency F1. Thus, for the first frequency F1, the Doherty amplifier output combiner of FIG. 4 has a 3:2 configuration, with three quarter-wave transmission lines in first path 421 and two quarter-wave transmission lines in second path 422. At a second frequency F2 of a second band of operation, the series combination of adjacent transmission lines 406 and 410 in second path 422 effectively approximates a quarter-wave transmission line for the wavelength of the second frequency F2, and the series combination of adjacent transmission lines 405, 409, and 413 in first path 421 effectively approximates a half-wave transmission line (e.g., two consecutive quarter-wave transmission lines) for the wavelength of the second frequency F2. The term "effectively approximates" is used to mean the length is within a tolerance that allows the transmission line to provide the same effective result as a transmission line of the length being approximated. As an example, the same effective result for a quarter-wave transmission line is impedance inversion, wherein the impedance at the output of the quarter-wave transmission line is plotted in an opposite area of a Smith chart as the impedance at the input of the quarter-wave transmission line. As another example, the same effective result for a half-wave transmission line is lack of impedance inversion, wherein the impedance at the output of the half-wave transmission line is plotted in a similar area of the Smith chart as the impedance at the input of the half-wave transmission line.

In accordance with at least one embodiment, a Doherty amplifier is configured with an output combiner network capable of providing dual-band operation, wherein operation in a first band is selected by configuring a first Doherty amplifier gain element of the Doherty amplifier to operate as a carrier gain element and configuring a second Doherty amplifier gain element of the Doherty amplifier to operate as a peaking gain element and wherein operation in a second band is selected by configuring the first Doherty amplifier gain element to operate as the peaking gain element and configuring the second Doherty amplifier gain element to operate as the carrier gain element. A Doherty amplifier can be useful for modern wireless communication, as a Doherty amplifier can provide high efficiency at a back-off region that exists at power output levels lower than saturation, with modern modulation systems for digital signals typically operating substantially in such back-off region. Wireless communication requires high data rate which can be achieved through increasing the bandwidth of the amplifier in the base station. Usually the conventional Doherty amplifier is capable of handling only single frequency band and normally fails to cover dual bands. This deficiency is mainly due to the bandwidth limitation of the output combiner.

In accordance with at least one embodiment, a Doherty amplifier can provide increased bandwidth in one or both of two ways. For mean b values from Table 3 near one, such as the 5:4, 5:6 configuration having a mean b value of 0.82 or the 7:6, 5:6 configuration having a mean b value of 1.18, contiguous bandwidth of a Doherty amplifier can be increased by defining two bands within that increased contiguous bandwidth and by switching the amplifier gain element bias based on the portion of that increased contiguous bandwidth currently being used. For mean b values from Table 3 farther from one, such as the 7:4, 1:2 configuration having a mean b value of 3.75, the 3:2, 1:2 configuration having a mean b value of 1.75, or the 5:2, 1:2 configuration having a mean b value of 2.25, multiple discrete bands substantially distance from each other in the wireless communications radio frequency (RF) spectrum can be supported by a single Doherty amplifier. Through use of different configurations having different mean b values in Table 3, different dual bands with different frequency relationships between them can be implemented, which can be useful for different band allocations in different geographic areas. The ability to provide operation on two bands which can be far from each other in frequency can overcome the bandwidth limitation of the output combiner in Doherty amplifier.

By implementing a dual-band Doherty amplifier utilizing the same matching elements in an output matching network for both bands, significant cost and size reduction can be realized. Space and weight requirements as well as cost can be reduced by providing a single Doherty amplifier for two different bands. A dual band Doherty amplifier can be implemented based on swapping the gate bias between the carrier and the peaking drive signals to select the band of operation. As an example, 3:2 and 7:4 quarter-wave configuration of an output matching network can be used to approximate the 1:2 quarter wave configuration (known as inverted Doherty) when the gate bias is swapped.

The design of such amplifier can be achieved by considering any quarter wave combination close to another usable Doherty output matching network combination, such as a 1:2 configuration. As an example, 7:4 quarter wave configuration for a higher frequency band has similar ratio when the carrier and peaking biased are reversed (i.e. 4:7≈1:2 for a lower frequency band). For an even cruder, but still implementable, approximation, the 3:2 quarter-wave configuration can be used for higher band and consequently 2:3≈1:2 will be used for lower band after swapping the gate bias. Gate bias can be automatically switched to interchange the gain elements between the bands based on a frequency of operation provided to a controller, such as controller 107 of FIG. 1. The controller can also automatically configure the input splitter to control phase and electrical delay matching between the two Doherty paths, for example, to change the path in which a phase delay (e.g., 90 degrees of phase angle) is provided for an input signal provided to one of the two gain elements of the Doherty amplifier system.

In accordance with at least one embodiment, a dual band Doherty amplifier can be implemented using gallium nitride (GaN), gallium arsenide (GaAs), or silicon (Si) semiconductor device technology. While the foregoing is described with respect to wireless communications, at least one embodiment may be implemented for wired communications.

In accordance with at least one embodiment, a Doherty amplifier includes a first Doherty amplifier gain element, a second Doherty amplifier gain element, and a gate bias circuit. The gate bias circuit provides a first bias signal to the first Doherty amplifier gain element and a second bias signal to the second Doherty amplifier gain element when a signal being amplified by the Doherty amplifier is in a first frequency band. The gate bias circuit provides the first bias signal to the second Doherty amplifier gain element and the second bias signal to the first Doherty amplifier gain element when the signal is in a second frequency band. In accordance with at least one embodiment, the Doherty amplifier further includes a first transmission line coupled at a first end of the first transmission line to an output of the first Doherty amplifier gain element and a second transmission line coupled at a first end of the second transmission line to an output of the second Doherty amplifier gain element and a second end of the first transmission line is coupled to a second end of the second transmission line. The first transmission line has a first electrical length that is substantially a first odd multiple of a first quarter wavelength of the signal when the signal is in the first frequency band. The second transmission line has a second electrical length that is substantially a second odd multiple of a second quarter wavelength of the signal when the signal is in the second frequency band. In accordance with at least one embodiment, the second transmission line has an electrical length that is substantially a first even multiple of the first quarter wavelength of the signal when the signal is in the first frequency band and the first transmission line has an electrical length that is substantially a second even multiple of the second quarter wavelength of the signal when the signal is in the second frequency band. In accordance with at least one embodiment, the Doherty amplifier further includes an adjustable amplitude and phase splitter coupled to a first input of the first Doherty amplifier gain element and to a second input of the second Doherty amplifier gain element. The adjustable amplitude and phase splitter is configured to adjust a phase relationship between a first input signal at the first input and a second input signal at the second input to compensate for an approximation selected from a group consisting of a first approximation of the first electrical length to a first length and a second approximation of the second electrical length to a second length. The first length is the first odd multiple of the first quarter wavelength of the signal when the signal is in the first frequency band, and the second length is the second odd multiple of the second quarter wavelength of the signal when the signal is in the second frequency band. In accordance with at least one embodiment, the first bias signal corresponds to a Class AB amplifier mode, and the second bias signal corresponds to a Class C amplifier mode. In accordance with at least one embodiment, the first bias signal is adjusted to operate the first Doherty amplifier gain element in the first frequency band and to operate the second Doherty amplifier gain element in the second frequency band, and the second bias signal is adjusted to operate the second Doherty amplifier gain element in the first frequency band and to operate the first Doherty amplifier gain element in the second frequency band. In accordance with at least one embodiment, the first bias signal determines operation as a Doherty carrier amplifier and the second bias signal determines operation as a Doherty peaking amplifier.

In accordance with at least one embodiment, a method of operation in a Doherty amplifier system includes determining if a signal is in a first band or in a second band and, when the signal is in the first band, providing a first bias signal to a first bias input of a first amplifier gain element of a Doherty amplifier and a second bias signal to a second bias input of a second amplifier gain element of the Doherty amplifier. A first output of the first amplifier gain element is coupled to a first series of a first number of quarter-wave transmission line elements for the first band and a second output of the second amplifier gain element is coupled to a second series of a second number of quarter-wave transmission line elements for the first band. The first number is not equal to the second number. The method further includes, when the signal is in the second band, providing the second bias signal to the first bias input of the first amplifier gain element of the Doherty amplifier and the first bias signal to the second bias input of the second amplifier gain element of the Doherty amplifier. In accordance with at least one embodiment, the method further includes providing, by the first series, a third number of quarter-wave transmission line elements for the second band based on a difference of wavelengths between the first band and the second band and providing, by the second series, a fourth number of quarter-wave transmission line elements for the second band based on the difference of the wavelengths between the first band and the second band. In accordance with at least one embodiment, the method further includes providing a carrier amplifier signal based on the first bias signal and providing a peaking amplifier signal based on the second bias signal. The first number of quarter-wave transmission line elements is a first odd number, the second number of quarter-wave transmission line elements is a first even number, the third number of quarter-wave transmission line elements is a second even number, and the fourth number of quarter-wave transmission line elements is a second odd number. In accordance with at least one embodiment, the method further includes establishing the first series to include an entire first path from the first output of the first amplifier gain element to an output merging point and the second series to include an entire second path from the second output of the second amplifier gain element to the output merging point. In accordance with at least one embodiment, the method further includes configuring a Class AB amplifier mode based on the first bias signal and configuring a Class C amplifier mode based on the second bias signal. In accordance with at least one embodiment, the method further includes adjusting a phase difference of a first gain element input signal applied to a first input of the first amplifier gain element and a second gain element input signal applied to a second input of the second amplifier gain element to provide compensation for a first electrical length of the first series of the first number of quarter-wave transmission line elements for the first band and for a second electrical length of the second series of the second number of quarter-wave transmission line elements for the first band. In accordance with at least one embodiment, the method further includes operating the first amplifier gain element as a carrier amplifier and the second amplifier gain element as a peaking amplifier for the first band and operating the second amplifier gain element as a carrier amplifier and the first amplifier gain element as a peaking amplifier for the second band.

In accordance with at least one embodiment, a Doherty amplifier system includes a first amplifier gain element, a first transmission line coupled to a first output of the first amplifier gain element, a second amplifier gain element, a second transmission line coupled to a second output of the second amplifier gain element, and a controller coupled to a first bias input of the first amplifier gain element and to a second bias input of the second amplifier gain element. The controller is configured, when a signal to be amplified by the first amplifier gain element and the second amplifier gain element is in a first band, to provide a first bias signal to the first bias input of the first amplifier gain element and a second bias signal to the second bias input of the second amplifier gain element and, when the signal is in a second band, to provide the second bias signal to the first bias input of the first amplifier gain element and the first bias signal to the second bias input of the second amplifier gain element. In accordance with at least one embodiment, the first transmission line includes, for the first band, a first series of a first number of quarter-wave transmission line elements and the second transmission line includes, for the first band, a second series of a second number of quarter-wave transmission line elements, wherein the first number is not equal to the second number. In accordance with at least one embodiment, the first series provides, for the second band, a third number of quarter-wave transmission line elements and the second series provides, for the second band, a fourth number of quarter-wave transmission line elements, a first different between the first number and the third number and a second different between the second number and the fourth number based on a difference of wavelengths between the first band and the second band. In accordance with at least one embodiment, the first bias signal corresponds to a carrier amplifier signal and the second bias signal corresponds to a peaking amplifier signal, wherein first number of quarter-wave transmission line elements is a first odd number, the second number of quarter-wave transmission line elements is a first even number, the third number of quarter-wave transmission line elements is a second even number, and the fourth number of quarter-wave transmission line elements is a second odd number. In accordance with at least one embodiment, the first bias signal corresponds to a Class AB amplifier mode and the second bias signal corresponds to a Class C amplifier mode. In accordance with at least one embodiment, the first amplifier gain element is configured to operate as a carrier amplifier and the second amplifier gain element is configured to operate as a peaking amplifier for the first band, and the second amplifier gain element is configured to operate as a carrier amplifier and the first amplifier gain element is configured to operate as a peaking amplifier for the second band.

Note that not all of the activities or elements described above in the general description are required, that a portion of a specific activity or device may not be required, and that one or more further activities may be performed, or elements included, in addition to those described. Still further, the order in which activities are listed is not necessarily the order in which they are performed.

Also, the concepts have been described with reference to specific embodiments. However, one of ordinary skill in the art appreciates that various modifications and changes can be made without departing from the scope of the present disclosure as set forth in the claims below.

It will be appreciated that, insofar as embodiments are implemented by a computer program, then a nontransitory storage medium carrying the computer program forms an aspect of the corresponding claimed subject matter. The computer program may for instance include one or more of: a subroutine, a function, a procedure, an object method, an object implementation, an executable application, an applet, a servlet, a source code, an object code, a shared library/ dynamic load library and/or other sequence of instructions designed for execution on a computer system or processing device. The transmission medium may be, as examples, a CD-ROM, a diskette, a non-volatile memory device, or the like.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:

1. A Doherty amplifier comprising:
a first Doherty amplifier gain element;
a first transmission line coupled to a first output of the first Doherty amplifier gain element, wherein the first transmission line comprises, for a first frequency band, a first series of a first number of quarter-wave transmission line elements;
a second Doherty amplifier gain element;
a second transmission line coupled to a second output of the second amplifier gain element, wherein the second transmission line comprises, for the first frequency band, a second series of a second number of quarter-wave transmission line elements, wherein the first number is not equal to the second number, wherein the first series provides, for a second frequency band, a third number of quarter-wave transmission line elements and the second series provides, for the second frequency band, a fourth number of quarter-wave transmission line elements, a first difference between the first number and the third number and a second difference between the second number and the fourth number based on a difference of wavelengths between the first band and the second band; and
a gate bias circuit for providing a first bias signal to the first Doherty amplifier gain element and a second bias signal to the second Doherty amplifier gain element when a signal being amplified by the Doherty amplifier is in the first frequency band and for providing the first bias signal to the second Doherty amplifier gain element and the second bias signal to the first Doherty amplifier gain element when the signal is in the second frequency band.

2. The Doherty amplifier of claim 1 further comprising:
a first transmission line coupled at a first end of the first transmission line to an output of the first Doherty amplifier gain element; and
a second transmission line coupled at a first end of the second transmission line to an output of the second Doherty amplifier gain element and a second end of the first transmission line is coupled to a second end of the second transmission line, wherein
the first transmission line has a first electrical length that is substantially a first odd multiple of a first quarter wavelength of the signal when the signal is in the first frequency band, and
the second transmission line has a second electrical length that is substantially a second odd multiple of a second quarter wavelength of the signal when the signal is in the second frequency band.

3. The Doherty amplifier of claim 2 wherein the second transmission line has an electrical length that is substantially a first even multiple of the first quarter wavelength of the signal when the signal is in the first frequency band and the first transmission line has an electrical length that is substantially a second even multiple of the second quarter wavelength of the signal when the signal is in the second frequency band.

4. The Doherty amplifier of claim 2 further comprising:
an adjustable amplitude and phase splitter coupled to a first input of the first Doherty amplifier gain element and to a second input of the second Doherty amplifier gain element, wherein the adjustable amplitude and phase splitter is configured to adjust a phase relationship between a first input signal at the first input and a second input signal at the second input to compensate for an approximation selected from a group consisting of a first approximation of the first electrical length to a first length and a second approximation of the second electrical length to a second length, the first length being the first odd multiple of the first quarter wavelength of the signal when the signal is in the first frequency band and the second length being the second odd multiple of the second quarter wavelength of the signal when the signal is in the second frequency band.

5. The Doherty amplifier of claim 1 wherein the first bias signal corresponds to a Class AB amplifier mode and the second bias signal corresponds to a Class C amplifier mode.

6. The Doherty amplifier of claim 1, wherein
the first bias signal is adjusted to operate the first Doherty amplifier gain element in the first frequency band and to operate the second Doherty amplifier gain element in the second frequency band, and
the second bias signal is adjusted to operate the second Doherty amplifier gain element in the first frequency band and to operate the first Doherty amplifier gain element in the second frequency band.

7. The Doherty amplifier of claim 1 wherein the first bias signal determines operation as a Doherty carrier amplifier and the second bias signal determines operation as a Doherty peaking amplifier.

8. A method of operation in a Doherty amplifier system comprising:
determining if a signal is in a first band or in a second band;
when the signal is in the first band, providing a first bias signal to a first bias input of a first amplifier gain element of a Doherty amplifier and a second bias signal to a second bias input of a second amplifier gain element of the Doherty amplifier, wherein
a first output of the first amplifier gain element is coupled to a first series of a first number of quarter-wave transmission line elements for the first band and a second output of the second amplifier gain element is coupled to a second series of a second number of quarter-wave transmission line elements for the first band, and
the first number is not equal to the second number;
when the signal is in the second band, providing the second bias signal to the first bias input of the first amplifier gain element of the Doherty amplifier and the first bias signal to the second bias input of the second amplifier gain element of the Doherty amplifier;
providing, by the first series, a third number of quarter-transmission line elements for the second band based on difference of wavelengths between the first band and the second band; and
providing, by the second series, a fourth number of quarter-wave transmission line elements for the second band based on difference of the wavelengths between the first band and the second band.

9. The method of claim 8 further comprising:
providing a carrier amplifier signal based on the first bias signal; and
providing a peaking amplifier signal based on the second bias signal, wherein the first number of quarter-wave transmission line elements is a first odd number, the second number of quarter-wave transmission line elements is a first even number, the third number of quarter-wave transmission line elements is a second even number, and the fourth number of quarter-wave transmission line elements is a second odd number.

10. The method of claim 8 further comprising:
establishing the first series to include an entire first path from the first output of the first amplifier gain element to an output merging point and the second series to include an entire second path from the second output of the second amplifier gain element to the output merging point.

11. The method of claim 8 further comprising:
configuring a Class AB amplifier mode based on the first bias signal; and
configuring a Class C amplifier mode based on the second bias signal.

12. The method of claim 8 further comprising:
adjusting a phase difference of a first gain element input signal applied to a first input of the first amplifier gain element and a second gain element input signal applied to a second input of the second amplifier gain element to provide compensation for a first electrical length of the first series of the first number of quarter-wave transmission line elements for the first band and for a second electrical length of the second series of the second number of quarter-wave transmission line elements for the first band.

13. The method of claim 8 further comprising:
operating the first amplifier gain element as a carrier amplifier and the second amplifier gain element as a peaking amplifier for the first band; and
operating the second amplifier gain element as a carrier amplifier and the first amplifier gain element as a peaking amplifier for the second band.

14. A Doherty amplifier system comprising:
a first amplifier gain element;
a first transmission line coupled to a first output of the first amplifier gain element;
a second amplifier gain element;
a second transmission line coupled to a second output of the second amplifier gain element;
a controller coupled to a first bias input of the first amplifier gain element and to a second bias input of the second amplifier gain element, the controller configured, when a signal to be amplified by the first amplifier gain element and the second amplifier gain element is in a first band, to provide a first bias signal to the first bias input of the first amplifier gain element and a second bias signal to the second bias input of the second amplifier gain element and, when the signal is in a second band, to provide the second bias signal to the first bias input of the first amplifier gain element and the first bias signal to the second bias input of the second amplifier gain element, wherein the first transmission line comprises, for the first band, a first series of a first number of quarter-wave transmission line elements and the second transmission line comprises for the first band a second series of a second number of quarter-wave transmission line elements, wherein the first number is not equal to the second number, wherein the first series provides, for the second band, a third number of quarter-wave transmission line elements and the second series provides, for the second band, a fourth number of quarter-wave transmission line elements, a first difference between the first number and the third number and a second difference between the second number and the fourth number based on a difference of wavelengths between the first band and the second band.

15. The Doherty amplifier system of claim 14 wherein the first bias signal corresponds to a carrier amplifier signal and the second bias signal corresponds to a peaking amplifier signal, wherein first number of quarter-wave transmission line elements is a first odd number, the second number of quarter-wave transmission line elements is a first even number, the third number of quarter-wave transmission line elements is a second even number, and the fourth number of quarter-wave transmission line elements is a second odd number.

16. The Doherty amplifier system of claim 14 wherein the first bias signal corresponds to a Class AB amplifier mode and the second bias signal corresponds to a Class C amplifier mode.

17. The Doherty amplifier system of claim 14 wherein the first amplifier gain element is configured to operate as a carrier amplifier and the second amplifier gain element is configured to operate as a peaking amplifier for the first band, and the second amplifier gain element is configured to operate as a carrier amplifier and the first amplifier gain element is configured to operate as a peaking amplifier for the second band.

* * * * *